(12) United States Patent
Kwack

(10) Patent No.: US 8,750,054 B2
(45) Date of Patent: Jun. 10, 2014

(54) DATA INPUT/OUTPUT CIRCUIT AND SEMICONDUCTOR MEMORY DEVICE

(75) Inventor: Seung Wook Kwack, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 217 days.

(21) Appl. No.: 13/341,435

(22) Filed: Dec. 30, 2011

(65) Prior Publication Data

US 2013/0033943 A1 Feb. 7, 2013

(30) Foreign Application Priority Data

Aug. 5, 2011 (KR) .................. 10-2011-0078291

(51) Int. Cl.
*G11C 7/10* (2006.01)

(52) U.S. Cl.
USPC ............ 365/189.05; 365/189.14; 365/189.15; 365/189.16; 365/203

(58) Field of Classification Search
USPC ................. 365/189.05, 203, 189.14, 189.15, 365/189.16
See application file for complete search history.

(56) References Cited

U.S. PATENT DOCUMENTS

| | | | | |
|---|---|---|---|---|
| 5,886,947 A | * | 3/1999 | Lee | 365/233.1 |
| 5,901,091 A | * | 5/1999 | Lee | 365/189.05 |
| 6,052,328 A | * | 4/2000 | Ternullo et al. | 365/233.16 |
| 6,456,543 B1 | * | 9/2002 | Lee | 365/190 |
| 6,678,759 B2 | * | 1/2004 | Stockton et al. | 710/52 |
| 6,930,940 B2 | * | 8/2005 | Haraguchi | 365/203 |
| 7,110,321 B1 | * | 9/2006 | Gibson | 365/189.02 |
| 8,081,530 B2 | * | 12/2011 | Chou | 365/207 |
| 2011/0026337 A1 | * | 2/2011 | Kwack | 365/193 |

FOREIGN PATENT DOCUMENTS

KR 1020050073749 A 7/2005

\* cited by examiner

*Primary Examiner* — Pho M Luu
(74) *Attorney, Agent, or Firm* — William Park & Associates Patent Ltd.

(57) ABSTRACT

A data input/output circuit includes: an amplification unit configured to generate a data signal by amplifying data of a first input/output line coupled to a bank during a read operation, and generate a driving signal by amplifying data of a second input/output line coupled to a data input/output pad during a write operation; a read driving unit configured to drive the second input/output line in response to the data signal during the read operation; and a write driving unit configured to drive the first input/output line in response to the driving signal during the write operation.

14 Claims, 3 Drawing Sheets

DATA INPUT/OUTPUT CIRCUIT AND SEMICONDUCTOR MEMORY DEVICE

CROSS-REFERENCES TO RELATED APPLICATIONS

The present application claims priority under 35 U.S.C 119(a) to Korean Application No. 10-2011-0078291, filed on Aug. 5, 2011, in the Korean intellectual property Office, which is incorporated herein by reference in its entirety set forth in full.

BACKGROUND

In general, an electronic device including a semiconductor memory device needs a memory control circuit for controlling the semiconductor memory device. In order to meet the timing specification related to the memory control circuit and improve the performance of the electronic device, technologies for high-speed operation and high-speed interface are applied to the semiconductor memory device. For example, a synchronous semiconductor memory device interfacing with the memory control circuit in synchronization with a system bus has been developed.

Also, in order to improve the performance of the semiconductor memory device, the amount of data inputted/outputted per unit time should be increased. Therefore, a configuration of a data input/output line which couples the semiconductor memory device to the outside also serves an important factor for the improvement in the performance of the semiconductor memory device.

Further, in general, a highly-integrated semiconductor memory device includes a plurality of banks sharing a global input/output line through which data are inputted and outputted. The respective banks, included in the semiconductor memory device configured in such a manner, input and output data through the shared global input/output line during a read operation and a write operation.

FIG. 1 illustrates data paths when a known semiconductor memory device performs read and write operations, respectively. Referring to FIG. 1, the data paths will be described as follows.

When the read operation is performed, data stored in a memory cell included in a bank BANK is sensed, amplified and then loaded into a local input/output line pair LIO and LIOB, and an input/output line sense amplifier IOSA amplifies the data loaded into the local input/output line pair LIO and LIOB and outputs the amplified data to the outside of the semiconductor memory device through a global input/output line pair GIO and GIOB.

When the write operation is performed, data inputted from outside is loaded into the global input/output line pair GIO and GIOB, and a write driver WDRV amplifies the data loaded into the global input/output line pair GIO and GIOB and stores the amplified data in a memory cell included in the bank BANK through the local input/output line pair LIO and LIOB.

As described above, the known semiconductor memory device include the write driver WDRV for amplifying data loaded into the global input/output line pair GIO and GIOB during the write operation and the input/output line sense amplifier IOSA for amplifying data loaded into the local input/output line pair LIO and LIOB during the read operation, for each bank. Therefore, the write driver WDRV and the input/output sense amplifier IOSA are separately provided for each bank included in the semiconductor memory device.

SUMMARY

An embodiment of the present invention relates to a semiconductor memory device capable of minimizing an area occupied by a data input/output circuit for inputting and outputting data during a read operation and a write operation.

In an embodiment, a data input/output circuit includes: an amplification unit configured to generate a data signal by amplifying data of a first input/output line coupled to a bank during a read operation and generate a driving signal by amplifying data of a second input/output line during a write operation; a read driving unit configured to drive the second input/output line in response to the data signal during the read operation; and a write driving unit configured to drive the first input/output line in response to the driving signal during the write operation.

In an embodiment, a semiconductor memory device includes: a bank configured to input and output data through a first input/output line; and a data input/output circuit including an amplification unit configured to amplify data of the first input/output line during a read operation and amplify data of a second input/output line during a write operation. The data input/output circuit drives the second input/output line in response to a data signal generated by the amplification unit during the read operation and drives the first input/output line in response to a driving signal generated by the amplification unit during the write operation.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
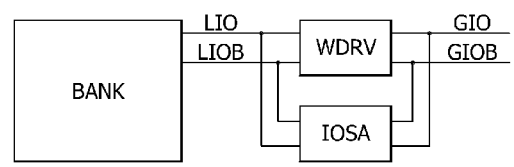
FIG. 1 illustrates data paths when a known semiconductor memory device performs read and write operations, respectively.
Figure 2:
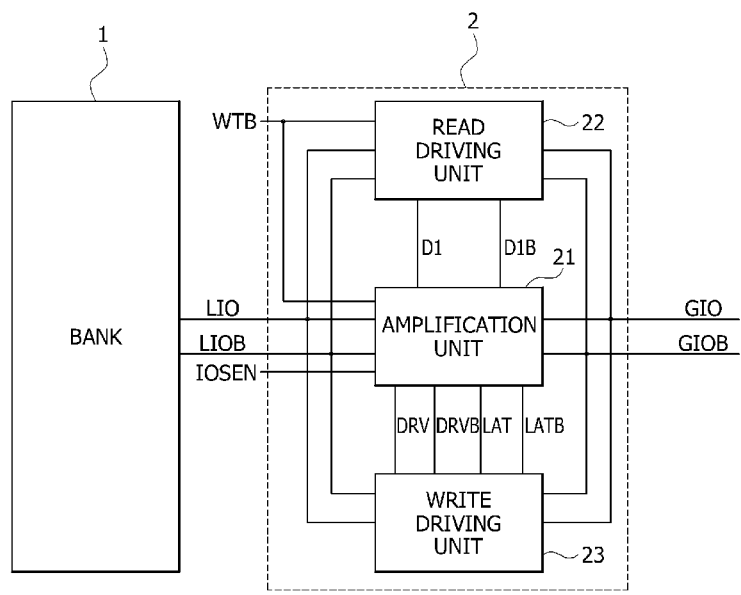
FIG. 2 is a block diagram of a semiconductor memory device in accordance with an embodiment of the present invention.

FIG. 2 is a block diagram of a semiconductor memory device in accordance with an embodiment of the present invention.

Referring to FIG. 2, the semiconductor memory device in accordance with an embodiment of the present invention includes a bank 1 and a data input/output circuit 2. The bank 1 is configured to input and output data through a first input/output line LIO and a first inverted input/output line LIOB. The data input/output circuit 2 includes an amplification unit 21, a read driving unit 22, and a write driving unit 23.

The amplification unit 21 is configured to receive signals of the first input/output line LIO and the first inverted input/output line LIOB in response to an output enable signal IOSEN which is enabled to a logic high level during a read operation, and differentially amplify the received signals to generate a data signal D1 and an inverted data signal D1B. Furthermore, the amplification unit 21 is configured to receive signals of a second input/output line GIO and a second inverted input/output line GIOB in response to a write signal WTB which is enabled to a logic low level during a write operation, and differentially amplify the received signals to generate a driving signal DRV, an inverted driving signal DRVB, a latch signal LAT, and an inverted latch signal LATB.

The read driving unit 22 is configured to receive the data signal D1 and the inverted data signal D1B in response to the write signal WTB, and drive the second input/output line GIO and the second inverted input/output line GIOB.

The write driving unit 23 is configured to receive the driving signal DRV, the inverted driving signal DRVB, the latch signal LAT, and the inverted latch signal LATB, and drive the first input/output line LIO and the first inverted input/output line LIOB.

Figure 3:
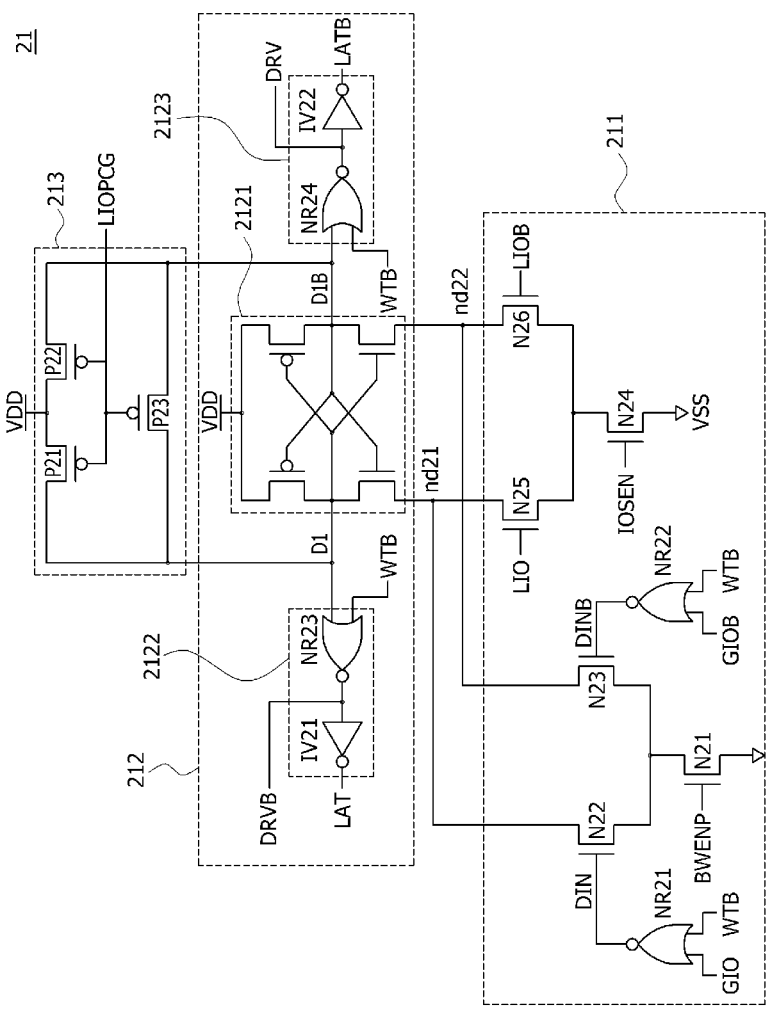
FIG. 3 is a circuit diagram of an amplification unit included in the semiconductor memory device of FIG. 2.

Referring to FIG. 3, the amplification unit 21 includes a data input section 211, a signal generation section 212, and a precharge section 213. The precharge section 213 includes PMOS transistors P21, P22, and P23 and is configured to drive the data signal D1 and the inverted data signal D1B to the level of a supply voltage VDD in response to a precharge signal LIOPCG which is inputted at a logic low level during a precharge operation.

The data input section 211 includes an NMOS transistor N21, a NOR gate NR21, an NMOS transistor NR22, a NOR gate NR22, and an NMOS transistor N23. The NMOS transistor N21 is configured to be turned on by receiving a write enable pulse BWENP which is applied at a logic high level during a write operation. The NOR gate NR21 is configured to receive a signal of the second input/output line GIO and the write signal WTB, and generate input data DIN. The NMOS transistor N22 is configured to be turned on by receiving the input data DIN and drive a first node 21. The NOR gate NR22 is configured to receive a signal of the second inverted input/output line GIOB and the write signal WTB, and generate inverted input data DINB. The NMOS transistor N23 is configured to be turned on by receiving the inverted input data DINB and drive a second node nd22.

Furthermore, the data input section 211 includes an NMOS transistor N24, an NMOS transistor N25, and an NMOS transistor N26. The NMOS transistor N24 is configured to be turned on by receiving an output enable signal IOSEN at a logic high level during a read operation. The NMOS transistor N25 is configured to be turned on by receiving a signal of the first input/output line LIO and drive the first node nd21. The NMOS transistor N26 is configured to be turned on by receiving a signal of the first inverted input/output line LIOB and drive the second node nd22.

The data input section 211 configured in such a manner receives the data of the first input/output line LIO and the first inverted input/output line LIOB during the read operation and receives the data of the second input/output line GIO and the second inverted input/output line GIOB during the write operation, thereby driving the first node nd21 and the second node nd22.

The signal generation section 212 includes a differential amplifier 2121, a first buffer 2122, and a second buffer 2123. The difference amplifier 2121 is configured to differentially amplify the signals of the first and second nodes nd21 and nd22 and generate the data signal D1 and the inverted data signal D1B. The first buffer 2122 includes a NOR gate NR23 and an inverter IN21. The NOR gate NR23 is configured to inversely buffer the data signal D1 in response to the write signal WTB which is applied at a logic low level during the write operation, and generate the inverted driving signal DRVB. The inverter IN21 is configured to inversely buffer the inverted driving signal DRVB and generate the latch signal LAT. The second buffer 2123 includes a NOR gate NR24 and an inverter IN22. The NOR gate NR24 is configured to inversely buffer the inverted data signal DIB in response to the write signal WTB which is applied at a logic low level during the write operation, and generate the driving signal DRV. The inverter IN22 is configured to inversely buffer the driving signal DRV and generate the inverted latch signal LATB.

Figure 4:
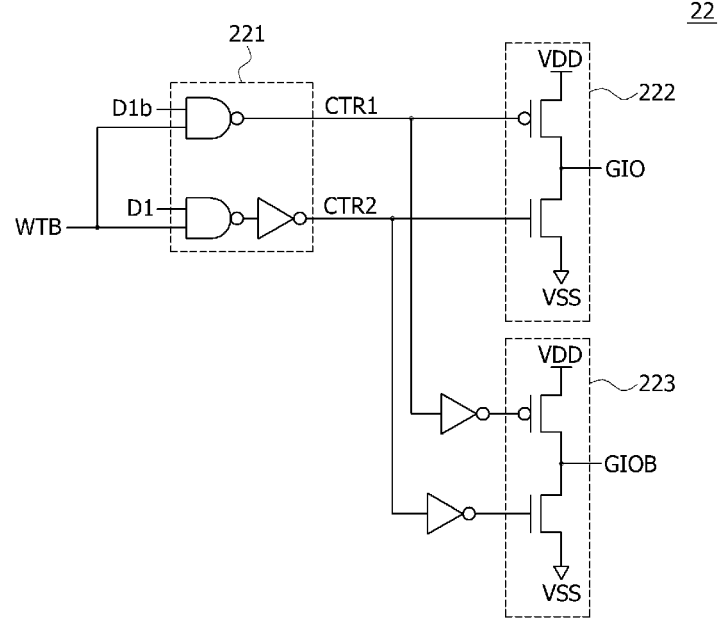
FIG. 4 is a circuit diagram of a write driving unit included in the semiconductor memory device of FIG. 2.

Referring to FIG. 4, the read driving unit 22 includes a control signal generation section 221, a first driving section 222, and a second driving section 223. The control generation section 221 is configured to buffer the data signal D1 and inversely buffer the inverted data signal D1B in response to the write signal WTB which is applied at a logic high level during the read operation, and generate first and second control signals CTR1 and CTR2, respectively. The first driving section 22 is configured to pull-up drive the second input/output line GIO to the level of the supply voltage VDD in response to the first control signal CTR1, and pull-down drive the second input/output line GIO to the level of a ground voltage VSS in response to the second control signal CTR2. The second driving section 223 is configured to pull-up drive the second inverted input/output line GIOB to the level of the supply voltage VDD in response to an inverted signal of the control signal CTR1, and pull-down drive the second inverted input/output line GIOB to the level of the ground voltage VSS in response to an inverted signal of the second control signal CTR2.

Figure 5:
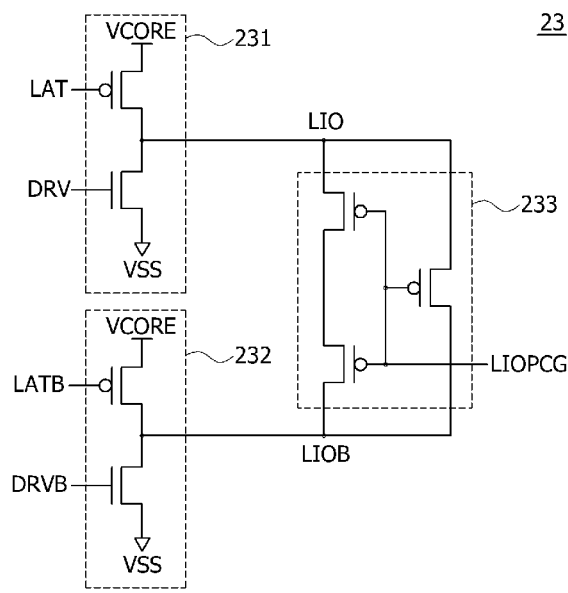
FIG. 5 is a circuit diagram of a read driving unit included in the semiconductor memory device of FIG. 2.

Referring to FIG. 5, the write driving unit 23 includes a third driving section 231, a fourth driving section 232, and an input/output line precharge section 233. The third driving section 231 is configured to pull-up drive the first input/output line LIO to the level of a core voltage VCORE in response to the latch signal LAT, and pull-down drive the first input/output line LIO to the level of the ground voltage VSS in response to the driving signal DRV. The fourth driving section 232 is configured to pull-up drive the first inverted input/output line LIOB to the level of the core voltage VCORE in response to the inverted latch signal LATB and pull-down drive the first inverted input/output line LIOB to the level of the ground voltage VSS in response to the inverted driving signal DRVB. The input/output line precharge section 233 is configured to couple the first input/output line LIO to the first inverted input/output line LIOB in response to the precharge signal LIOPCG.

Now, the data input/output operation of the semiconductor memory device configured in the above-described manner will be described. The data input/output operation may be divided into a read operation and a write operation.

When the read operation is performed, the amplification unit 21 receives signals of the first input/output line LIO and the first inverted input/output line LIOB in response to the output enable signal IOSEN which is enabled to a logic high level, differentially amplifies the received signals, and generates the data signal D1 and the inverted data signal D1B. The read driving unit 22 receives the data signal D1 and the inverted data signal D1B from the amplification unit 21 and drives the second input/output line GIO and the inverted second input/output line GIOB.

When the write operation is performed, the amplification unit 21 receives signals of the second input/output line GIO and the second inverted input/output line GIOB in response to the write signal WTB which is enabled to a logic low level during the write operation, differentially amplifies the received signals, and generates the driving signal DRV, the inverted driving signal DRVB, the latch signal LAT, and the inverted latch signal LATB. The write driving unit 23 receives the driving signal DRV, the inverted driving signal DRVB, the latch signal LAT, and the inverted latch signal LATB, and drives the first input/output line LIO and the first inverted input/output line LIOB.

As described above, the data input/output circuit 2 included in the semiconductor memory device in accordance with the embodiment of the present invention performs such functions as the known input/output line sense amplifier IOSA through the amplification unit 21 and the read driving unit 22 during the read operation, and performs such functions as the conventional write driver WDRV through the amplification unit 21 and the write driving unit 23 during the write operation. Therefore, the data input/output circuit 2 included in the semiconductor memory device in accordance with the embodiment of the present invention may minimize the area of the data input/output circuit by using the amplification unit 21 during the read operation and the write operation.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. A data input/output circuit comprising:
   an amplification unit configured to generate a data signal by amplifying data of a first input/output line coupled to a bank during a read operation, and generate a driving signal by amplifying data of a second input/output line coupled to a data input/output pad during a write operation;
   a read driving unit configured to drive the second input/output line in response to the data signal during the read operation; and
   a write driving unit configured to drive the first input/output line in response to the driving signal during the write operation, wherein the amplification unit comprises a data input section configured to receive the data of the first input/output line and drive first and second nodes during the read operation, and receive the data of the second input/output line and drive the first and second nodes during the write operation, and a signal generation section configured to differentially amplify signals of the first and second nodes to generate the data signal during the read operation and the driving signal during the write operation.

2. The data input/output circuit of claim 1, wherein the data input section comprises:
   a first driver configured to drive the first node in response to the data of the first input/output line during the read operation;
   a second driver configured to drive the second node in response to data of a first inverted input/output line during the read operation;
   a third driver configured to drive the first node in response to the data of the second input/output line during the write operation; and
   a fourth driver configured to drive the second node in response to data of a second inverted input/output line during the write operation.

3. The data input/output circuit of claim 1, wherein the signal generation section comprises:
   a differential amplifier configured to perform differential amplification in response to the signals of the first and second nodes and generate the data signal and an inverted data signal;
   a first buffer configured to buffer the data signal in response to a write signal enabled during the write operation and generate an inverted driving signal; and
   a second buffer configured to buffer the inverted data signal in response to the write signal and generate the driving signal.

4. The data input/output circuit of claim 1, wherein the amplification unit further comprises a precharge section configured to drive the data signal to a preset level during a precharge operation.

5. The data input/output circuit of claim 1, wherein the read driving unit comprises:
   a control signal generation section configured to buffer the data signal and the inverted data signal in response to a write signal enabled during the write operation and generate first and second control signals; and
   a driving section configured to pull-up drive the second input/output line in response to the first control signal and pull-down drive the second input/output line in response to the second control signal.

6. The data input/output circuit of claim 1, wherein the write driving unit comprises a driving section configured to pull-up drive the first input/output line in response to a latch signal and pull-down drive the second input/output line in response to the driving signal.

7. The data input/output circuit of claim 6, wherein the write driving unit further comprises an input/output line precharge section configured to couple the first input/output line and a first inverted input/output line during a precharge operation.

8. A semiconductor memory device comprising:
   a bank configured to input and output data through a first input/output line and a second input/output line;
   a data input section configured to receive data of a first input/output line and drive first and second nodes during a read operation, and receive data of a second input/output line and drive the first and second nodes during a write operation;
   a signal generation section configured to differentially amplify signals of the first and second nodes to generate a data signal during the read operation and a driving signal during the write operation;
   a read driving unit configured to drive the second input/output line in response to the data signal during the read operation; and
   a write driving unit configured to drive the first input/output line in response to the driving signal during the write operation.

9. The semiconductor memory device of claim 8, wherein the data input section comprises:
   a first driver configured to drive the first node in response to the data of the first input/output line during the read operation;
   a second driver configured to drive the second node in response to data of a first inverted input/output line during the read operation;

a third driver configured to drive the first node in response to the data of the second input/output line during the write operation; and a fourth driver configured to drive the second node in response to data of a second inverted input/output line during the write operation.

10. The semiconductor memory device of claim 8, wherein the signal generation section comprises:

a differential amplifier configured to perform differential amplification in response to the signals of the first and second nodes and generate the data signal and an inverted data signal;

a first buffer configured to buffer the data signal in response to a write signal enabled during the write operation and generate an inverted driving bar signal; and a second buffer configured to buffer the inverted data signal in response to the write signal and generate the driving signal.

11. The semiconductor memory device of claim 8, wherein the amplification unit further comprises a precharge section configured to drive the data signal to a preset level during a precharge operation.

12. The semiconductor memory device of claim 8, wherein the read driving unit comprises:

a control signal generation section configured to buffer the data signal and the inverted data signal in response to a write signal enabled during the write operation and generate first and second control signals; and a driving section configured to pull-up drive the second input/output line in response to the first control signal and pull-down drive the second input/output line in response to the second control signal.

13. The semiconductor memory device of claim 8, wherein the write driving unit comprises a driving section configured to pull-up drive the first input/output line in response to a latch signal and pull-down drive the second input/output line in response to the driving signal.

14. The semiconductor memory device of claim 13, wherein the write driving unit further comprises an input/output line precharge section configured to couple the first input/output line and a first inverted input/output line during a precharge operation.

* * * * *